(12) United States Patent
Park

(10) Patent No.: US 7,732,223 B2
(45) Date of Patent: Jun. 8, 2010

(54) MAGNETIC MEMORY DEVICE AND METHOD FOR MANUFACTURING THE SAME

(75) Inventor: Song Hee Park, Dongjak-gu (KR)

(73) Assignee: Dongbu Hitek Co., Ltd., Seoul (KR)

( * ) Notice: Subject to any disclaimer, the term of this patent is extended or adjusted under 35 U.S.C. 154(b) by 222 days.

(21) Appl. No.: 11/930,472

(22) Filed: Oct. 31, 2007

(65) Prior Publication Data
US 2008/0157239 A1    Jul. 3, 2008

(30) Foreign Application Priority Data
Dec. 27, 2006    (KR)    ...... 10-2006-0135703

(51) Int. Cl.
*H01L 43/00*    (2006.01)
(52) U.S. Cl. ............ 438/3; 257/421; 257/E29.164; 365/145; 365/158
(58) Field of Classification Search ........ 257/421, 257/E29.164, 758; 365/145, 158, 182; 438/3
See application file for complete search history.

(56) References Cited

U.S. PATENT DOCUMENTS

| | | | | |
|---|---|---|---|---|
| 5,106,776 A | * | 4/1992 | Shen et al. ............ | 438/248 |
| 6,621,730 B1 | * | 9/2003 | Lage ..................... | 365/158 |
| 6,667,526 B2 | * | 12/2003 | Komori .................. | 257/421 |
| 6,992,342 B2 | * | 1/2006 | Motoyoshi et al. ....... | 257/295 |
| 7,145,796 B2 | * | 12/2006 | Fukuzumi et al. ........ | 365/158 |
| 2006/0027847 A1 | * | 2/2006 | Koo et al. ............... | 257/295 |

FOREIGN PATENT DOCUMENTS

KR    10-2000-0075528    6/2002

* cited by examiner

*Primary Examiner*—Allan R. Wilson
(74) *Attorney, Agent, or Firm*—Saliwanchik, Lloyd & Saliwanchik

(57) ABSTRACT

A magnetic memory device and a manufacturing method thereof are provided. The magnetic memory device can include a word line, a freely switchable layer, a fixed layer, a dielectric layer, and a bit line. The freely switchable layer can be electrically connected to a diffusion region at one side of the word line, and the fixed layer can be horizontally adjacent to the freely switchable layer. The dielectric layer can be provided between the freely switchable layer and the fixed layer, and the bit line can be electrically connected to the fixed layer.

7 Claims, 5 Drawing Sheets

MAGNETIC MEMORY DEVICE AND METHOD FOR MANUFACTURING THE SAME

CROSS-REFERENCE TO RELATED APPLICATION

The present application claims the benefit under 35 U.S.C. §119 of Korean Patent Application No. 10-2006-0135703, filed Dec. 27, 2006, which is hereby incorporated by reference in its entirety.

BACKGROUND

Magnetic random access memory (MRAM) can be used as a non-volatile memory.

As a low-power consumption device capable of retaining data even when no power is supplied, MRAM is also suitable for reducing cell size, and is thus being adopted as a next generation memory device.

Therefore, it appears that dynamic RAM (DRAM), static RAM (SRAM), and flash memory devices may be replaced by magnetic memory devices, which can be applied in personal computers, mainframe computers, smart cards, portable computers, mobile communication terminals, telephones, televisions, and other electronic devices.

A magnetic memory device typically uses a magnetic tunnel junction (MTJ) with an insulating layer inserted between a fixed layer and a freely switchable layer.

A magnetic memory device can store different values of contact resistances manifested with the magnetic moment of the fixed layer and the magnetic moment of the freely switchable layer inversed as digital states D0 and D1, respectively. The digital states of the magnetic memory device can generally be sustained as long as no external magnetic field is applied exceeding the anti-magnetic field of the freely switchable layer.

The magnetic memory device can sense the stored digital states by either supplying a current to the MTJ to measure the applied voltage at the junction or by measuring a flowing current with an applied predetermined voltage.

BRIEF SUMMARY

Embodiments of the present invention provide a magnetic memory device including a magnetic tunnel junction and a manufacturing method thereof.

According to an embodiment of the present invention, a magnetic memory device can include a word line on a semiconductor substrate, and a freely switchable layer electrically connected to a diffusion region at one side of the word line. A fixed layer can be provided horizontally adjacent to the freely switchable layer, and a dielectric layer can be provided between the freely switchable layer and the fixed layer. A bit line can be electrically connected to the fixed layer.

In an embodiment, a method for manufacturing a magnetic memory device can include: forming a metal pad on a semiconductor substrate including a word line, a first diffusion region, and a second diffusion region, where the metal pad is electrically connected to the first diffusion region; forming an interlayer insulating layer on the metal pad; forming a first trench in the interlayer insulating layer exposing a portion of the metal pad; forming a freely switchable layer in the first trench; forming a second trench in the interlayer insulating layer exposing a side surface of the freely switchable layer; forming a dielectric layer in the second trench; forming a fixed layer in the second trench on the dielectric layer; and forming a bit line electrically connected to the fixed layer.

The details of one or more embodiments are set forth in the accompanying drawings and the detailed description below. Other features will be apparent to one skilled in the art from the detailed description, the drawings, and the appended claims.

DETAILED DESCRIPTION

When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present.

Figure 5:
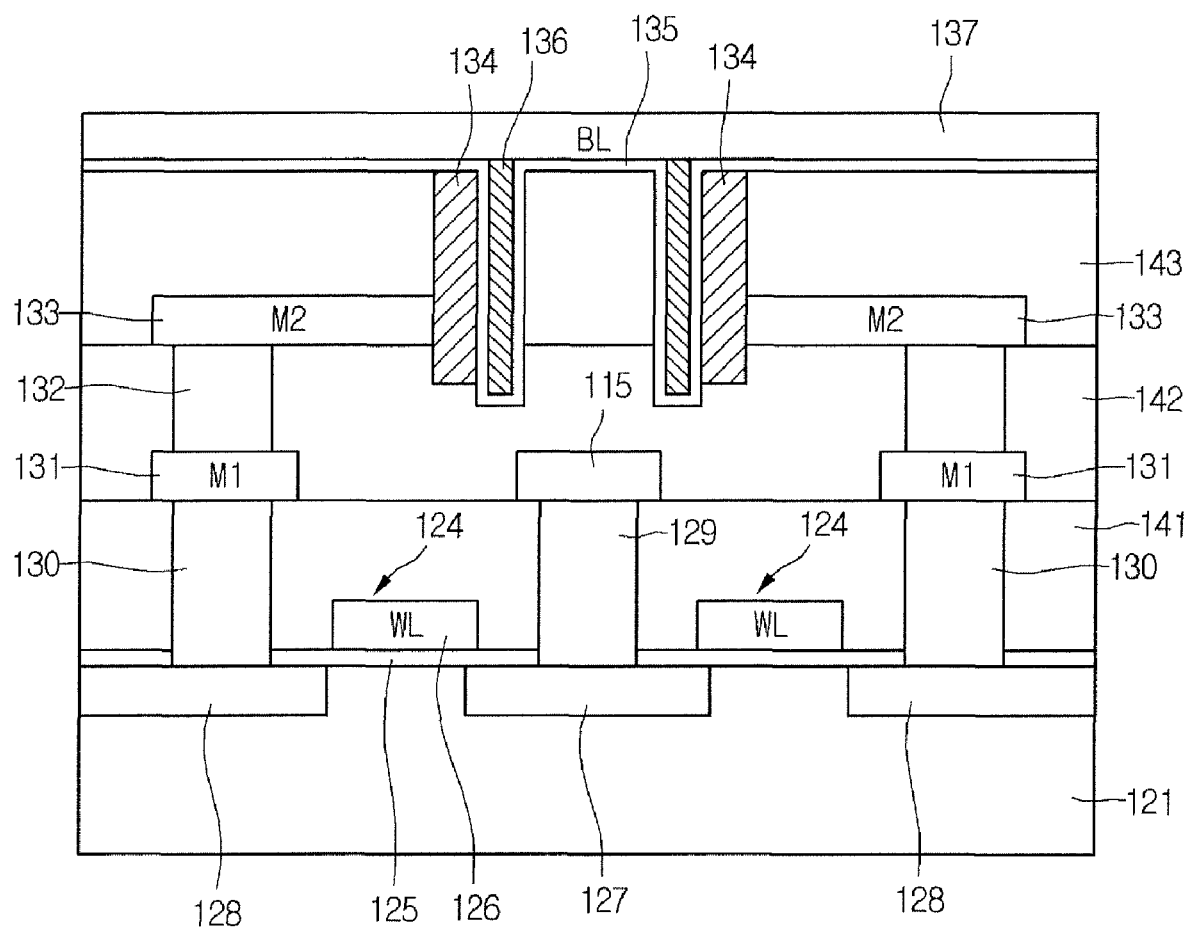

FIG. 5 is a cross-sectional view of a magnetic memory device according to an embodiment of the present invention.

Referring to FIG. 5, a semiconductor substrate 121 can include a P-type well region (not shown) provided on its surface. The semiconductor substrate 121 can be, for example, a P-type semiconductor substrate. The P-type well can include a device isolation region (not shown) for isolating a transistor forming region. The device isolation region can be formed, for example, through a shallow trench isolation (STI) process.

The P-type well region can include field effect transistors 124. Each field effect transistor 124 can have a gate insulating layer 125 and a gate electrode (word line) 126 on the P-type well region.

Each field effect transistor 124 can include diffusion regions 127 and 128 in the P-type well region on either side of the gate electrode 126. The diffusion regions 127 and 128 can be, for example, N+ diffusion regions.

In an embodiment, two field effect transistors 124 can share a single diffusion region 127.

The field effect transistors 124 can function as switching devices in order to read stored data.

The field effect transistors 124 are not limited to N-type or P-type field effect transistors, and can be, for example, alternate switching devices such as diodes or bipolar transistors.

A first insulating layer 141 can be provided for insulating the field effect transistors 124. The first insulating layer 141 can include contacts 129 and 130 that can each contact a diffusion region 127 and 128. The contacts 129 and 130 can be conductive plugs and can be comprised of a refractory metal. The refractory metal can be, for example, tungsten.

A sense line 115 contacting a contact 129 can be formed on the first insulating layer 141. Also, a first metal pad 131 contacting another contact 130 can be formed on the first insulating layer 141.

A second insulating layer 142 can be formed to insulate the sense line 115, the first metal pad 131, and other elements that may be present on the first insulating layer 141.

The second insulating layer 142 can include a contact 132 contacting the first metal pad 131. A second metal pad 133 can be formed in contact with the contact 132 on the second insulating layer 142.

A third insulating layer 143 can be formed to insulate the second metal pad 133 and other elements that may be present on the second insulating layer 142.

A magnetic tunnel junction (MTJ) can be formed on the semiconductor substrate 121 in the third insulating layer 143 and the second insulating layer 142. The MTJ can include a freely switchable layer 134, a fixed layer 136, and a dielectric layer 135 provided between the freely switchable layer 134 and the fixed layer 136. A bit line 137 can be formed on the fixed layer 136.

The magnetic memory device can have the MTJ formed such that the freely switchable layer 134, the dielectric layer 135, and the fixed layer 136 are horizontally arranged.

The horizontally-arranged MTJ can be applied to various designs of highly-integrated magnetic memory devices.

FIGS. 1 to 5 are cross-sectional views illustrating a method for manufacturing a magnetic memory device according to an embodiment of the present invention.

Figure 1:
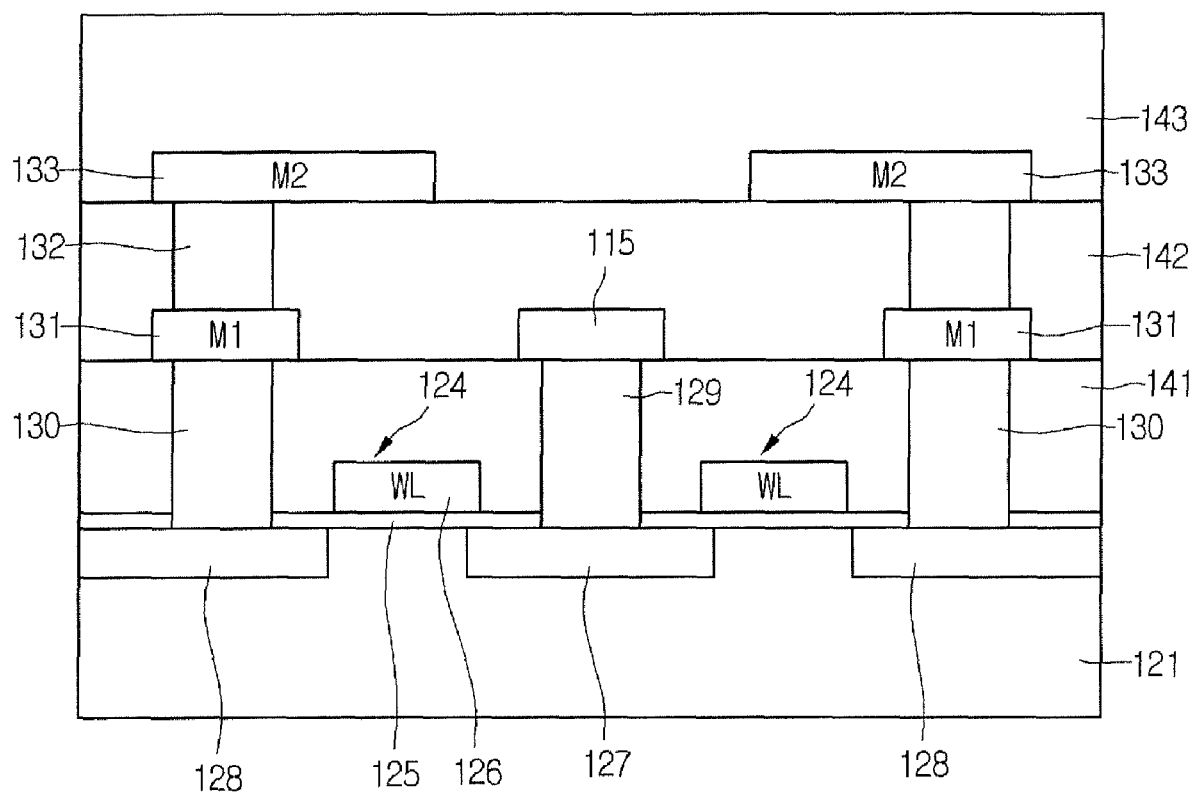
FIGS. 1 to 5 are cross-sectional views illustrating a manufacturing method of a magnetic memory device according to an embodiment of the present invention.

Referring to FIG. 1, a semiconductor substrate 121 can include a P-type well region (not shown) on its surface. The P-type well region can include a device isolation region (not shown) for isolating a transistor forming region. The device isolation region can be formed, for example, through a STI process.

The P-type well region can include field effect transistors 124. Each field effect transistors 124 can include a gate electrode (word line) 126 through a gate insulating layer 125 on the P-type well region. Each field effect transistor 124 can also include diffusion regions 127 and 128 in the P-type well region on either side of the gate electrode 126. The diffusion regions 127 and 128, can be, for example, N+ diffusion regions.

In an embodiment, two field effect transistors 124 can share a single diffusion region 127.

The field effect transistors 124 can function as switching devices in order to read stored data. The field effect transistors 124 are not limited to being N-type or P-type field effect transistors, and can be, for example, alternate switching devices such as diodes or bipolar transistors.

Also, a first insulating layer 141 can be formed for insulating the field effect transistors 124. The first insulating layer 141 can include contacts 129 and 130 that can each contact a diffusion region 127 and 128.

A sense line 115 contacting a contact 129 can be formed on the first insulating layer 141. Also, a first metal pad 131 contacting another contact 130 can be formed on the first insulating layer 141.

A second insulating layer 142 can be formed to insulate the sense line 115, the first metal pad 131, and other elements that may be formed on the first insulating layer 141.

The second insulating layer 142 can includes a contact 132 contacting the first metal pad 131. The contact 132 can be a conductive plug and can be comprised of a refractory metal. The refractory metal can be, for example, tungsten. A second metal pad 133 contacting the contact 132 can be formed on the second insulating layer 142.

Then, a third insulating layer 143 can be formed on the second insulating layer 142 including the second metal pad 133.

Figure 2:
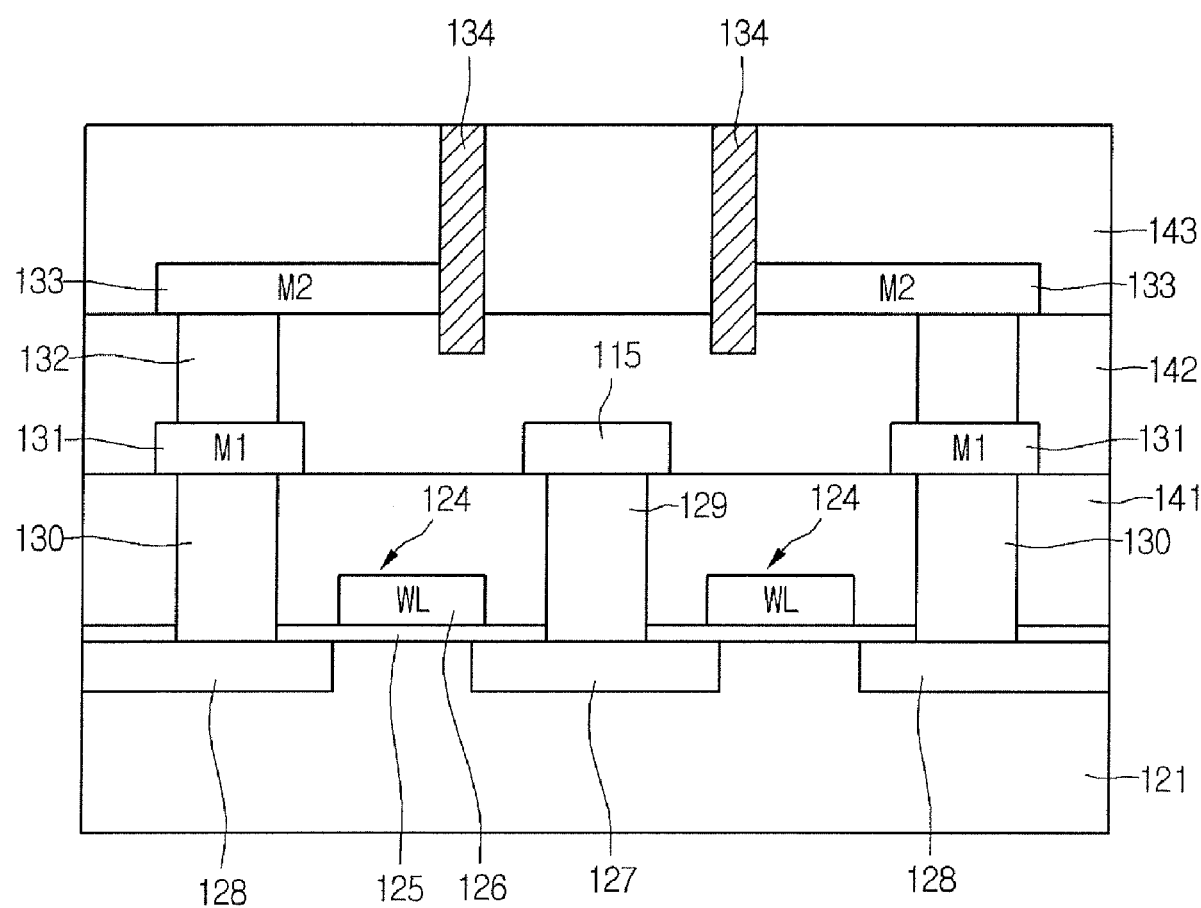

Referring to FIG. 2, a photoresist pattern (not shown) can be formed on the third insulating layer 143. The second insulating layer 142 and the third insulating layer 143 can be etched, using the photoresist pattern as an etch mask, to form trenches. In an embodiment, the trenches can be formed in order to expose portions of the second metal pad 133. The photoresist pattern can then be removed.

A freely switchable layer 134 can be formed in the trenches. The freely switchable layer 134 can be a magnetic layer.

Figure 3:
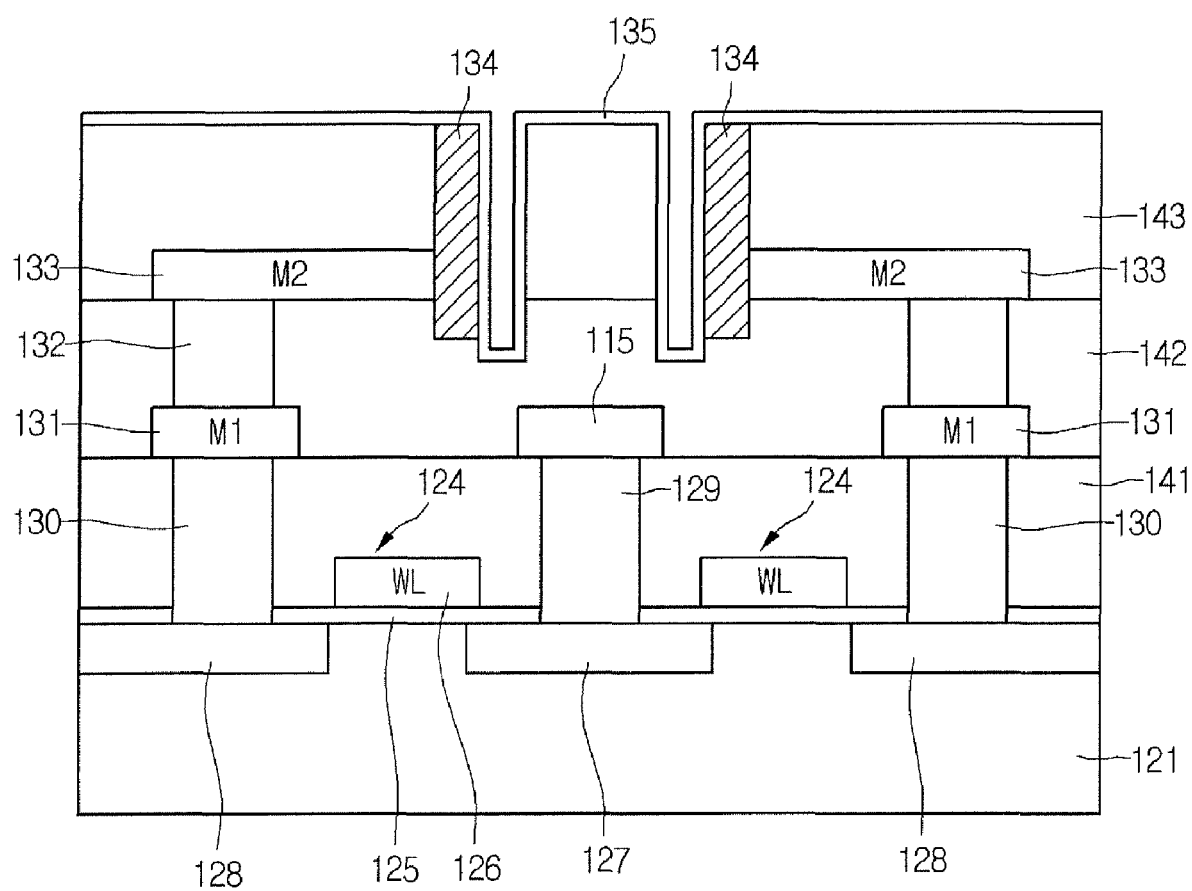

Referring to FIG. 3, a photoresist pattern (not shown) can be formed on the third insulating layer 143. The second insulating layer 142 and the third insulating layer 143 can be etched, using the photoresist pattern as an etch mask, to form trenches. In an embodiment, the trenches can be formed to expose a side surface of the freely switchable layer 134. The photoresist pattern can then be removed.

An insulating material can be filled in the trenches, and an etch back process can be performed to form a dielectric layer 135 in the trench and on the third insulating layer 143.

Figure 4:
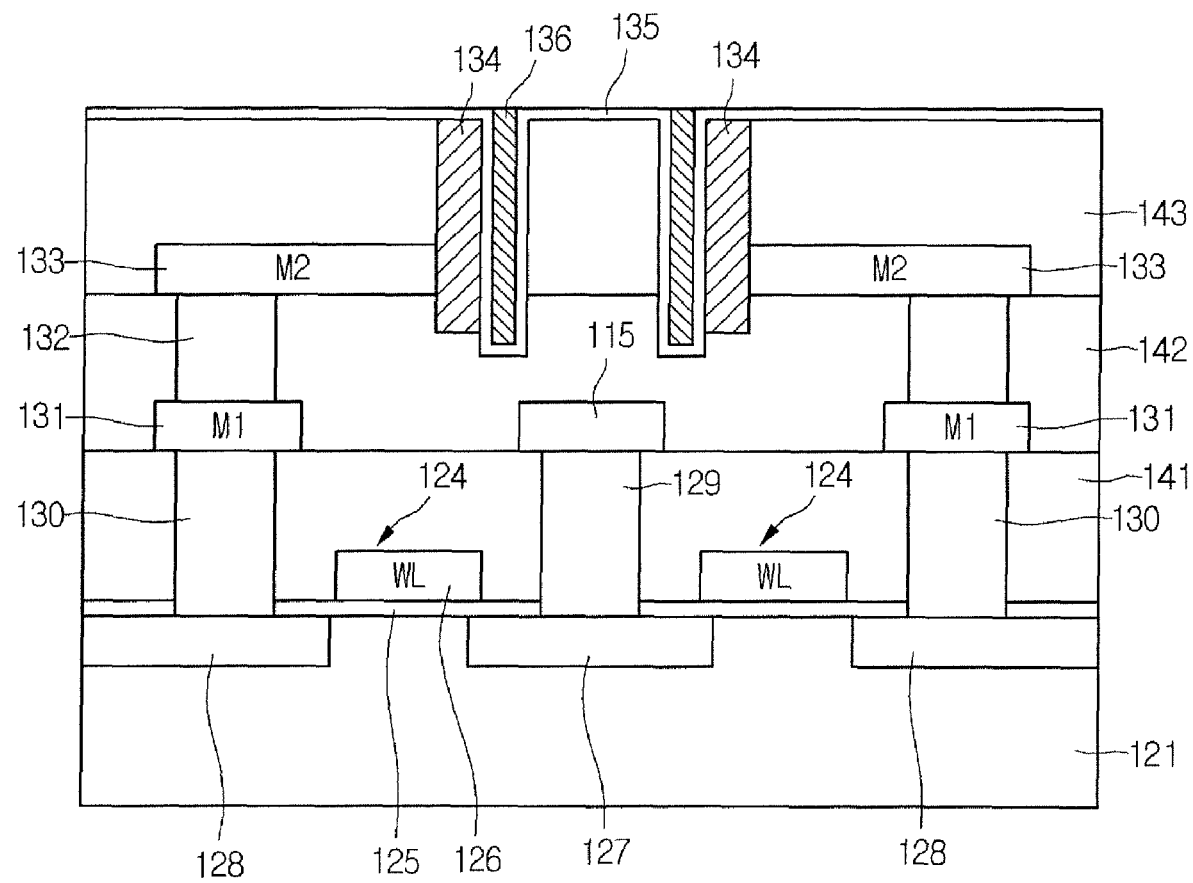

Referring to FIG. 4, a fixed layer 136 can be formed within the trench on the dielectric layer 135. The fixed layer 136 can be a magnetic layer.

Referring to FIG. 5, a bit line 137 can be formed on the dielectric layer 135 and the fixed layer 136 and electrically connected to the fixed layer 136.

Accordingly, in an embodiment, a magnetic memory device can have an MTJ with a freely switchable layer 134, a dielectric layer 135, and a fixed layer 136.

While the figures depict the second metal pad 133 directly connected to the freely switchable layer 134 and the fixed layer 136 directly connected to the bit line 137, a contact or another metal pad may be interposed therebetween.

Embodiments of the present invention provide a magnetic memory device and a manufacturing method thereof including an MTJ arranged in a horizontal direction. A variety of designs for highly-integrated magnetic memory devices can be enabled by the horizontally-arranged MTJ.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing a magnetic memory device, comprising:

forming a metal pad on a semiconductor substrate including a word line, a first diffusion region, and a second diffusion region, wherein the metal pad is electrically connected to the first diffusion region;

forming an interlayer insulating layer on the metal pad;

forming a first trench in the interlayer insulating layer to expose a portion of the metal pad;

forming a freely switchable layer in the first trench;

forming a second trench in the interlayer insulating layer to expose a side surface of the freely switchable layer;

forming a dielectric layer in the second trench;

forming a fixed layer in the second trench on the dielectric layer; and forming a bit line electrically connected to the fixed layer;

wherein the second trench is formed deeper than the first trench.

2. The method according to claim 1, further comprising forming a sense line electrically connected to the second diffusion region.

3. The method according to claim 1, wherein the dielectric layer is formed on both sides of and under the fixed layer.

4. The method according to claim 1, wherein the dielectric layer is formed on a side surface and an upper surface of the freely switchable layer.

5. The method according to claim 1, wherein the bit line is formed above the dielectric layer and the fixed layer.

6. The method according to claim 1, wherein forming the metal pad electrically connected to the diffusion region comprises:

forming a contact on the diffusion region; and forming the metal pad electrically connected to the contact.

7. The method according to claim 1, wherein forming the dielectric layer in the second trench comprises:

depositing an insulating material on the semiconductor substrate including in the second trench; and performing an etch back process on the insulating material.

* * * * *